(12) United States Patent
Wang et al.

(10) Patent No.: US 10,622,588 B2
(45) Date of Patent: Apr. 14, 2020

(54) THIN FILM PACKAGE STRUCTURE AND DISPLAY DEVICE

(71) Applicant: BOE TECHNOLOGY GROUP CO., LTD., Beijing (CN)

(72) Inventors: Tao Wang, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/332,153

(22) PCT Filed: May 14, 2018

(86) PCT No.: PCT/CN2018/086702
§ 371 (c)(1),
(2) Date: Mar. 11, 2019

(87) PCT Pub. No.: WO2018/223815
PCT Pub. Date: Dec. 13, 2018

(65) Prior Publication Data
US 2019/0221776 A1    Jul. 18, 2019

(30) Foreign Application Priority Data
Jun. 6, 2017    (CN) .................... 2017 2 0647902 U

(51) Int. Cl.
*H01L 51/52* (2006.01)
*H01L 51/56* (2006.01)
*H01L 27/32* (2006.01)

(52) U.S. Cl.
CPC .......... *H01L 51/5256* (2013.01); *H01L 27/32* (2013.01); *H01L 51/52* (2013.01); *H01L 51/56* (2013.01)

(58) Field of Classification Search
CPC ............... H01L 51/5246; H01L 51/524; H01L 51/5237; H05B 33/04; H01J 9/261
(Continued)

(56) References Cited

U.S. PATENT DOCUMENTS 6,791,660 B1 *    9/2004    Hayashi .............. B81C 1/00269
                                                             349/153
7,109,655 B2 *    9/2006    Kurihara ................. H01L 51/56
                                                             313/512
(Continued)

FOREIGN PATENT DOCUMENTS

| CN | 105449118 A | 3/2016 |
| CN | 106024834 A | 10/2016 |
| CN | 206774584 U | 12/2017 |

OTHER PUBLICATIONS

International Search Report and Written Opinion for Application No. PCT/CN2018/086702, dated Aug. 1, 2018, 9 Pages.

*Primary Examiner* — Christopher M Raabe
(74) *Attorney, Agent, or Firm* — Brooks Kushman P.C.

(57) ABSTRACT

A thin film packaging structure is provided, including a plurality of film layers coated on an outside of a component to be packaged, where the plurality of film layers includes sealing layers and a planazation layer arranged alternatively, and the film layer adjacent to the component to be packaged and the film layer away from the component to be packaged are the sealing layers, the sealing layers adjacent to each other enclose a formation region at which the planazation layer is arranged, and a promotion structure configured to promote a uniformity of the planazation layer is arranged at an edge of the formation region. A display device is further provided.

8 Claims, 3 Drawing Sheets

(58) Field of Classification Search
USPC .......................................................... 313/512
See application file for complete search history.

(56) References Cited

U.S. PATENT DOCUMENTS

| | | | | |
|---|---|---|---|---|
| 7,190,115 | B2* | 3/2007 | Tsuchiya | H01L 27/127 |
| | | | | 313/512 |
| 2001/0048234 | A1* | 12/2001 | Liu | B23K 26/324 |
| | | | | 297/3 |
| 2005/0264189 | A1* | 12/2005 | Choi | H01L 51/56 |
| | | | | 313/506 |
| 2006/0033429 | A1* | 2/2006 | Fujimura | H05B 33/04 |
| | | | | 313/509 |
| 2006/0202222 | A1* | 9/2006 | Lan | H01L 51/524 |
| | | | | 257/98 |
| 2007/0120132 | A1* | 5/2007 | Maruyama | H01L 51/524 |
| | | | | 257/79 |
| 2011/0140163 | A1* | 6/2011 | Oh | H01L 51/5256 |
| | | | | 257/100 |
| 2014/0159017 | A1* | 6/2014 | Ikeda | H01L 51/524 |
| | | | | 257/40 |
| 2014/0291630 | A1* | 10/2014 | Namkung | H01L 27/3244 |
| | | | | 257/40 |
| 2015/0021565 | A1* | 1/2015 | Min | H01L 51/5256 |
| | | | | 257/40 |
| 2015/0060806 | A1* | 3/2015 | Park | H01L 51/5253 |
| | | | | 257/40 |
| 2015/0123095 | A1* | 5/2015 | Washio | H01L 51/5243 |
| | | | | 257/40 |
| 2016/0043342 | A1 | 2/2016 | Lee et al. | |
| 2018/0040850 | A1 | 2/2018 | Huang | |
| 2018/0366680 | A1* | 12/2018 | Okigawa | H01L 51/5246 |

\* cited by examiner

US 10,622,588 B2

THIN FILM PACKAGE STRUCTURE AND DISPLAY DEVICE

CROSS REFERENCE OF RELATED APPLICATIONS

This application is the U.S. national phase of PCT Application No. PCT/CN2018/086702 filed on May 14, 2018, which claims priority to Chinese Patent Application No. 201720647902.3 filed on Jun. 6, 2017, which are incorporated hereby by reference in their entireties.

TECHNICAL FIELD

The present disclosure relates to the field of liquid crystal product manufacturing technology, and in particular to a thin film packaging structure and a display device.

BACKGROUND

OLED (Organic Light Emitting Diode) are considered to be the most promising flat panel display devices, and are considered to be the most promising display technologies for flexible display devices. However, the service life of OLED components has constrained the pace of industrialization. When the OLED component is in operation, electrons are injected from the cathode to the transport layer. In order to increase the number of injected carriers and improve the light-emitting efficiency, the cathode of the OLED adopts a material close to the work function of the light-emitting layer to reduce the energy level barrier. However such low work function metals such as magnesium, aluminum, and silver are all active materials that react easily with water and oxygen in the environment to render the device ineffective. In addition, the hole transport layer (HTL) and the electron transport layer (ETL) are easily corroded by water and oxygen, resulting in pixel damage and shortened the service life of the device. Therefore, the packaging technology is particularly important. An effective package prevents moisture and oxygen from immersing, prevents aging of organic materials, and extends the service life of OLED component.

SUMMARY

A thin film packaging structure is provided in the present disclosure, including a plurality of film layers coated on an outside of a component to be packaged, where the plurality of film layers includes sealing layers and a planazation layer arranged alternatively, and the film layer adjacent to the component to be packaged and the film layer away from the component to be packaged are the sealing layers, the sealing layers adjacent to each other enclose a formation region at which the planazation layer is arranged, and a promotion structure configured to promote a uniformity of the planazation layer is arranged at an edge of the formation region.

Optionally, the promotion structure includes at least one annular structure arranged at the edge of the formation region, and the at least one annular structure has a plurality of slits extending outward from a center of the formation region to form a plurality of capillary channels.

Optionally, the promotion structure includes at least two annular structures, the capillary channels of adjacent two annular structures are staggered.

Optionally, a width of the at least one annular structure is from 10 μm to 60 μm.

Optionally, a thickness of the at least one annular structure is not greater than a thickness of the planazation layer.

Optionally, the thickness of the at least one annular structure is from 0.5 μm to 2 μm.

Optionally, the at least one annular structure is of a quadrilateral structure, and a joint portion of adjacent two sides of the quadrilateral structure is right angled or rounded.

Optionally, the promotion structure is formed on a corresponding sealing layer by a photoresist through a photoetching process.

Optionally, the sealing layers are inorganic layers, and the planazation layer is an organic layer.

A display device including an OLED component and the thin film packaging structure hereinabove is further provided.

DETAILED DESCRIPTION

Figure 1:
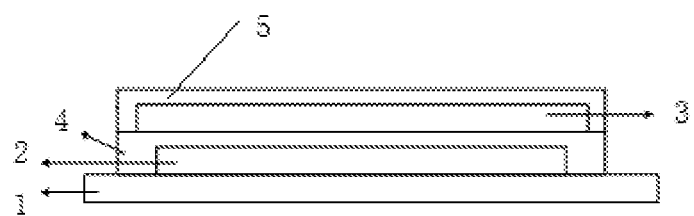
FIG. 1 is a schematic view of a thin film packaging structure in the related art.

The features and principles of the present disclosure are described in detail below with reference to the drawing. The embodiments are only for an illustration of the present disclosure, but not to limit the scope thereof.

At present, the reliability of packaging of OLEDs mainly depends on Thin Film Encapsulation (TFE). The use of the thin film encapsulation (TFE), i.e., inorganic/organic/inorganic multilayer stack structure to protect the OLED has become mainstream packaging manner of the OLED. As shown in FIG. 1, the OLED component 2 is arranged on the substrate 1. The OLED component 2 is externally packaged with a first inorganic layer 4, an organic layer 3, and a second inorganic layer 5. Among them, the inorganic layer is configured to block water oxygen, and the organic layer is for a coating and planarization.

The organic layer 5 is generally deposited on the first inorganic layer 4 in a liquid precursor manner, and after the surface of the first inorganic layer 4 is uniformly spread by the flowability of the liquid, it is fixed by a specific method. However, since the organic material itself does not have water-oxygen barrier properties, it is necessary to control the diffusion range of the organic liquid to be controlled in the inorganic layer having a water-like barrier function.

Figure 2:
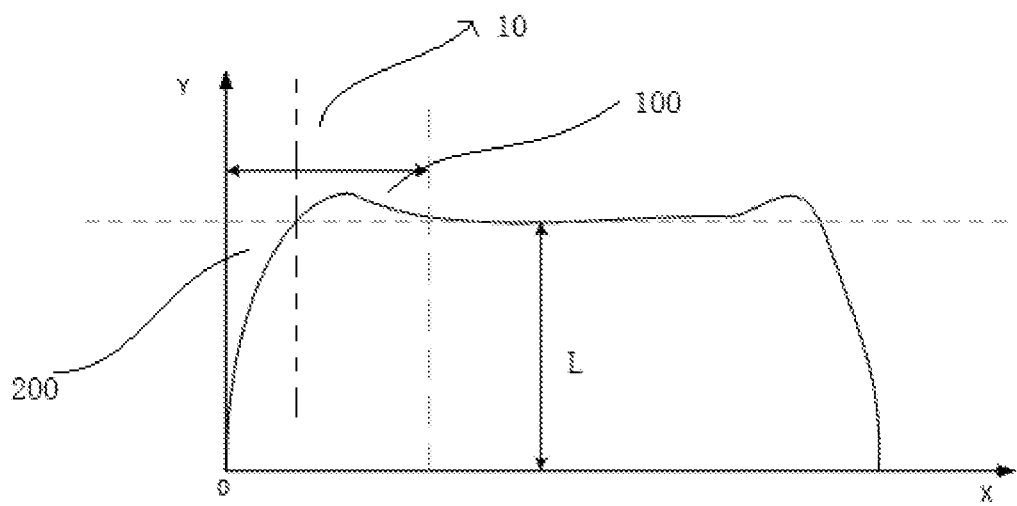
FIG. 2 is an enlarged sectional view of an organic layer in the related art.

The organic layer's transmittance, film thickness, film thickness uniformity, water content, gas release amount, and refractive index all have an effect on the performance of the organic layer. Among them, the thickness of the organic layer, the uniformity of the film thickness and the like have a great influence on the planarization of the organic layer, and the uniformity of the film thickness, especially the film thickness uniformity at the edge of the film layer directly affects the actual formation of the organic layer. The membrane area and the controllable range are shown in FIG. 2 as an enlarged schematic view of the cross-sectional morphology of the organic layer. The preset height of the organic layer is L, and there is an uneven phenomenon at the edge 10 of the organic layer, and the organic layer at the first region 100 near the center of the organic layer is relatively higher, and the organic layer at the second region 200 away from the center of the organic layer is relatively lower.

A thin film packaging structure is provided in some embodiments of the present disclosure, including a plurality of film layers coated on an outside of a component to be packaged, where the plurality of film layers includes sealing layers and a planazation layer arranged alternatively, and the film layer adjacent to the component to be packaged and the film layer away from the component to be packaged are the sealing layers, the sealing layers adjacent to each other enclose a formation region at which the planazation layer is arranged, and a promotion structure 6 configured to promote a uniformity of the planazation layer is arranged at an edge of the formation region.

Optionally, the sealing layers are inorganic layers, and the planazation layer is an organic layer.

By the promotion structure 6, when the organic layer is formed, the organic liquid is accelerated to flow to the edge, the uniformity of the edge of the organic layer is improved, and the promotion structure 6 is arranged at the edge of the forming region of the planazation layer, that is, the promotion structure 6 is coated within the sealing layer, so the overall package performance will not be adversely affected.

Figure 3:
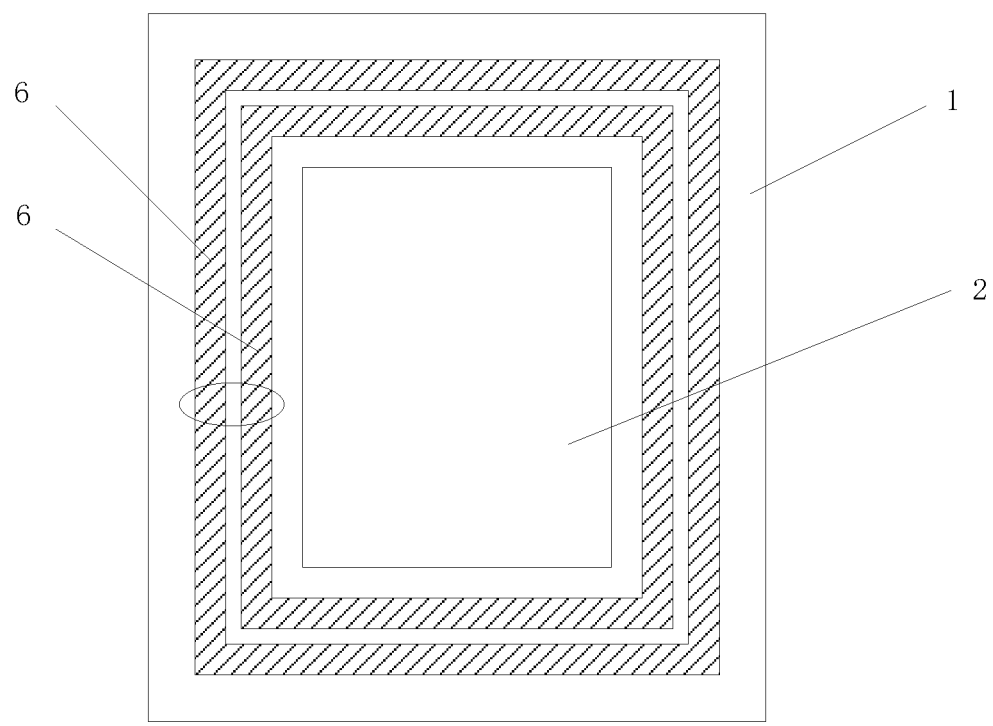
FIG. 3 is a schematic view of a thin film package structure in some embodiments of the present disclosure.
Figure 4:
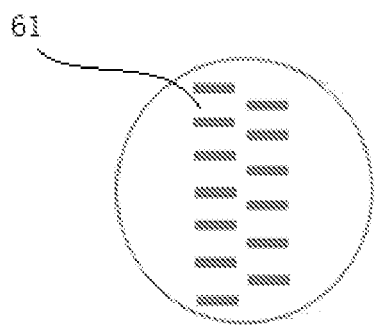
FIG. 4 is an enlarged view of the circled portion in FIG. 3.

The promotion structure 6 may have various structures, as long as the uniformity of the organic layer is improved. As shown in FIG. 3 and FIG. 4, in some embodiments of the present disclosure, the promotion structure 6 includes at least one annular structure arranged at the edge of the formation region, the at least one annular structure has a plurality of slits extending outward from a center of the formation region to form a plurality of capillary channels 61.

Figure 5:
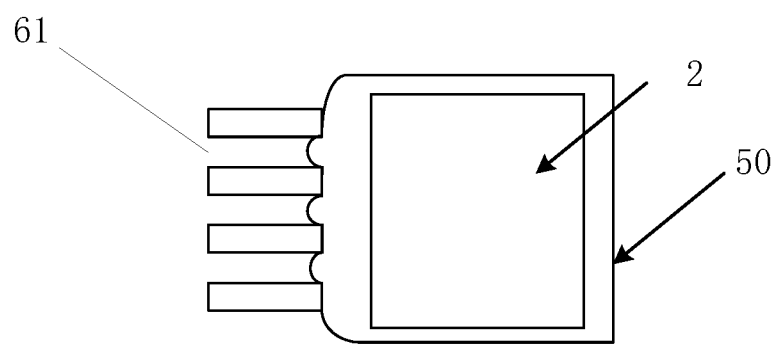
FIG. 5 is a schematic view showing a flow state of an organic liquid in some embodiments of the present disclosure.

When the organic layer is formed, the closer to the edge 10 of the formation region, the slower the flow velocity of the organic liquid is, and the liquid is accumulated in the first region 100 at the edge 10 of the formation region near the center of the formation region. At the second region 200 at the periphery of the first region 100, the liquid is gradually reduced, so that after the organic layer is formed, the thickness of the organic layer of the first region 100 is larger than the thickness of the center of the formation region, and the thickness of the organic layer of the second region 200 is lower than the thickness of the center of the formation region, so the thickness of the edge 10 of the formation region is not uniform. In some embodiments, by the promotion structure 6 and the capillary phenomenon, when the organic layer is formed, it is able to promote the movement of the organic liquid toward the edge 10, so as to correct the uneven thickness of the organic layer at the edge 10 of the formation region, thereby improving uniformity of the edge 10 of the formation region. FIG. 5 is a schematic view showing a flow state of an organic liquid 50 flowing to the edge of the formation region through the capillary channels 61.

As shown in FIG. 2, in the organic layer in the thin film packaging structure in the related art, the edge 10 of the formation region of the organic layer includes a first region 100 exceeding a predetermined height of the organic layer and a second region 200 at the periphery of the first region 100 and lower than the predetermined height of the organic layer. In some embodiments of the present disclosure, the promotion structure 6 includes an annular structure arranged at least at the second region 200. Due to the capillary phenomenon, when the organic liquid reaches the capillary channel 61, it overcomes the gravity and grows from bottom up, thereby accelerating the liquid flow at the boundary as a whole, which is advantageous for the decrease of the height of the film layer region having an uneven thickness (the first region 100) shown in FIG. 2, thereby correcting the uneven thickness of the edge 10 of the formation region.

The number of the annular structures may be set as needed. In order to promote the flow of the organic liquid more effectively, in some embodiments, when the promotion structure 6 includes at least two annular structures, the capillary channels 61 of adjacent two annular structures are staggered.

The width of the annular structure may be set as needed. In some embodiments, the width of the annular structure is from 10 μm to 60 μm.

In some embodiments, the thickness of the annular structure is not greater than the thickness of the planazation layer, so as to prevent the thickness of the organic layer at the annular structure from being greater than the thickness of the organic layer of other portions to affect the uniformity of the organic layer.

In some embodiments, the annular structure has a thickness of 0.5 μm to 2 μm.

The annular structure may be of a circular shape, a quadrangular shape or the like, and may be determined as needed. In some embodiments, the annular structure is of a quadrilateral structure, and a joint portion of adjacent two sides of the quadrilateral structure is right angled or rounded.

Optionally, the joint portion of adjacent two sides of the quadrilateral structure is rounded, so as to promote the flow of the organic liquid.

In some embodiments, the promoting structure 6 is formed on the corresponding sealing layer by a photoresist through a photoetching process.

In some embodiments, the component to be packaged is an OLED component 2, and the OLED component 2 is arranged on the substrate 1.

A display device is further provided in some embodiments of the present disclosure, including an OLED component and the thin film packaging structure hereinabove.

The above are merely some embodiments of the present disclosure, and it should be noted that those skilled in the art can make several improvements and refinements without departing from the principle of the present disclosure, and these improvements and refinements shall also fall within the scope of the present disclosure.

What is claimed is:

1. A thin film packaging structure, comprising a plurality of film layers coated on an outside of a component to be packaged, wherein the plurality of film layers comprises sealing layers and a planazation layer arranged alternatively, and the film layer adjacent to the component to be packaged and the film layer away from the component to be packaged are the sealing layers, the sealing layers adjacent to each other enclose a formation region at which the planazation layer is arranged, and a promotion structure is arranged at an edge of the formation region and is configured to promote an organic liquid to flow to the edge of the formation region,
wherein the promotion structure comprises two annular structures arranged at the edge of the formation region, and each of the two annular structures has a plurality of slits extending outward from a center of the formation region to form a plurality of capillary channels, and wherein the plurality of capillary channels of one of the two annular structures are staggered with the plurality of capillary channels of the other of the two annular structures.

2. The thin film packaging structure according to claim 1, wherein a width of each of the two annular structures is from 10 um to 60 um.

3. The thin film packaging structure according to claim 1, wherein a thickness of each of the two annular structures is not greater than a thickness of the planazation layer.

4. The thin film packaging structure according to claim 3, wherein the thickness each of the two annular structures is from 0.5 um to 2 um.

5. The thin film packaging structure according to claim 1, wherein each of the two annular structures is of a quadrilateral structure, and a joint portion of adjacent two sides of the quadrilateral structure is rounded.

6. The thin film packaging structure according to claim 1, wherein the promotion structure is formed on a corresponding sealing layer by a photoresist through a photoetching process.

7. The thin film packaging structure according to claim 1, wherein the sealing layers are inorganic layers, and the planazation layer is an organic layer.

8. A display device comprising an OLED component and the thin film packaging structure according to claim 1.

* * * * *